United States Patent
Motwani et al.

(10) Patent No.: US 12,106,815 B2
(45) Date of Patent: Oct. 1, 2024

(54) VARIABLE ERROR CORRECTION CODEWORD PACKING TO SUPPORT BIT ERROR RATE TARGETS

(71) Applicant: Intel Corporation, Santa Clara, CA (US)

(72) Inventors: Ravi Motwani, Fremont, CA (US); Pranav Kalavade, San Jose, CA (US); Rohit Shenoy, Fremont, CA (US); Rifat Ferdous, West Lafayette, IN (US)

(73) Assignee: Intel Coproration, Santa Clara, CA (US)

( * ) Notice: Subject to any disclaimer, the term of this patent is extended or adjusted under 35 U.S.C. 154(b) by 789 days.

(21) Appl. No.: 17/109,376

(22) Filed: Dec. 2, 2020

(65) Prior Publication Data

US 2021/0082535 A1    Mar. 18, 2021

(51) Int. Cl.
    *G11C 16/04* (2006.01)
    *G06F 12/0882* (2016.01)
    *G11C 29/14* (2006.01)
    *G11C 29/42* (2006.01)
    *G11C 29/44* (2006.01)

(52) U.S. Cl.
    CPC .......... *G11C 29/42* (2013.01); *G06F 12/0882* (2013.01); *G11C 29/14* (2013.01); *G11C 29/44* (2013.01)

(58) Field of Classification Search
    CPC .......... G11C 29/42; G11C 29/14; G11C 29/44
    See application file for complete search history.

(56) References Cited

U.S. PATENT DOCUMENTS

| | | | |
|---|---|---|---|
| 8,938,656 B2 * | 1/2015 | Liu | G06F 11/1012 714/763 |
| 9,430,326 B2 | 8/2016 | Barndt | |
| 9,798,622 B2 * | 10/2017 | Motwani | H03M 13/2909 |
| 9,811,269 B1 | 11/2017 | Ramalingam et al. | |
| 11,354,231 B2 * | 6/2022 | Yang | G06F 12/0246 |
| 2016/0299812 A1 | 10/2016 | Olbrich et al. | |

OTHER PUBLICATIONS

Extended European Search Report for European Patent Application No. 21196776.5, mailed Feb. 21, 2022, 7 pages.

* cited by examiner

*Primary Examiner* — Pho M Luu
(74) *Attorney, Agent, or Firm* — Jordan IP Law, LLC

(57) ABSTRACT

Systems, apparatuses and methods may provide for technology that programs a first plurality of error correction codewords to a first set of pages in a block of non-volatile memory, wherein the first plurality of error correction codewords are programmed at a first density. The technology may also program a second plurality of error correction codewords to a second set of pages in the block, wherein the second plurality of error correction codewords are programmed at a second density. The first density and the second density are different from one another.

20 Claims, 3 Drawing Sheets

VARIABLE ERROR CORRECTION CODEWORD PACKING TO SUPPORT BIT ERROR RATE TARGETS

TECHNICAL FIELD

Embodiments generally relate to memory structures. More particularly, embodiments relate to variable error correction codeword packing to support bit error rate targets in memory structures.

BACKGROUND

Multi-level NAND-type flash memory ("NAND memory") may be organized into multiple cells, with each cell storing multiple bits of data. In such a case, the number of bits per cell may depend on how many distinct voltage levels can be achieved during program operation(s) without reaching an unacceptable raw bit error rate (RBER). Indeed, increasing the number of bits per cell may present challenges with regard to RBER and performance though lowering the cost. More particularly, although error correction code (ECC) technology may be used to mitigate errors encountered when accessing (e.g., programming, reading) multi-level NAND memory, there remains considerable room for improvement.

For example, to support five bits per cell, thirty-two voltage levels ($2^5=32$) may be called for in order to distinguish between the thirty-two possible combinations of ones and zeros. An ECC codeword may include host data (e.g., the payload) and parity bits that are used to correct errors encountered due to overlap of the levels. While increasing the number of parity bits in the ECC codeword (e.g., and therefore increasing the size of the ECC codeword) may improve the ability to mitigate errors associated with an increased bits per cell, larger codewords implies a larger page size (increased cost) and also typically an increase in hardware complexity (e.g., gate count).

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

Figure 1:
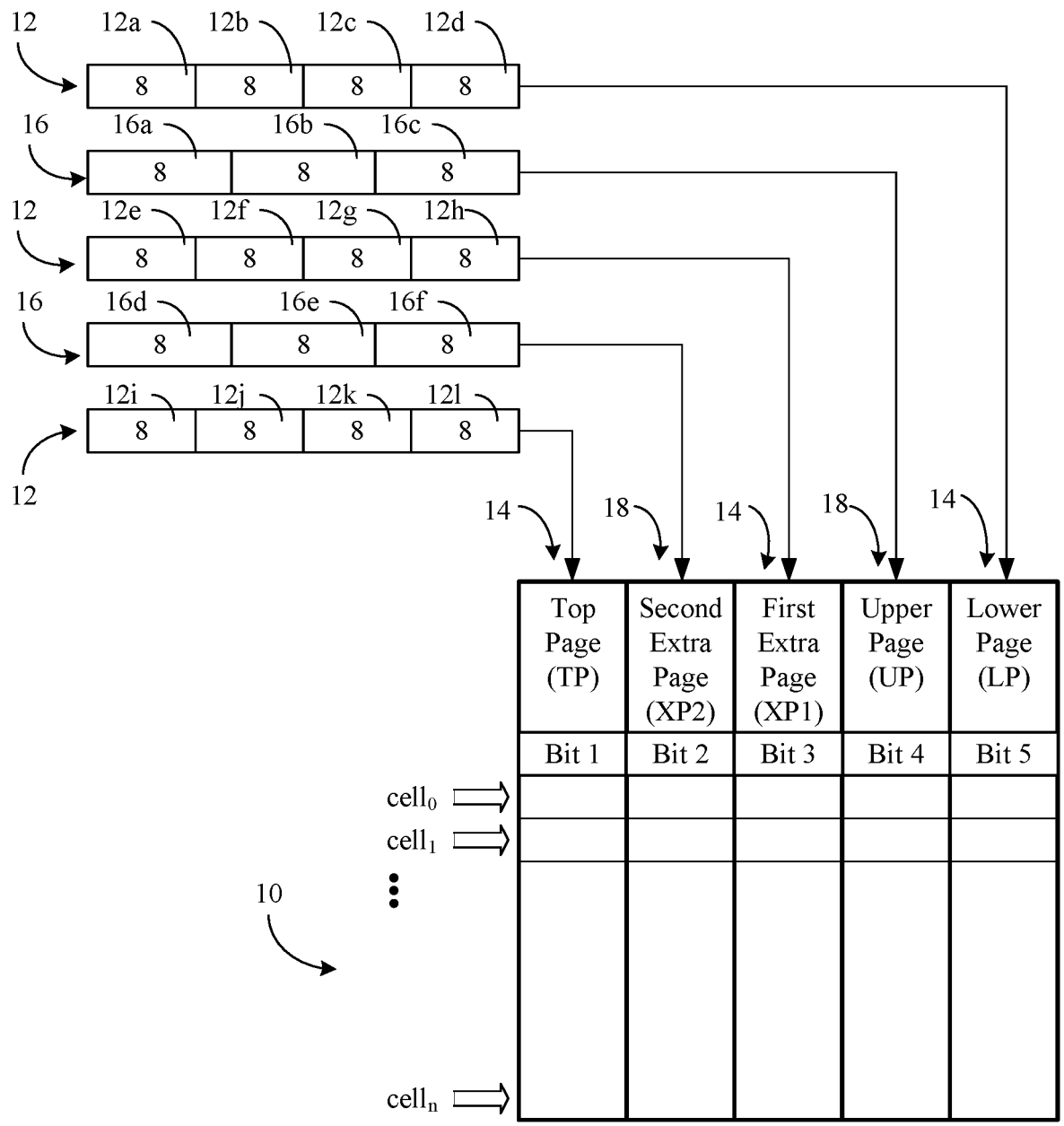
FIG. 1 is an illustration of an example of an error correction codeword distribution for a penta-level cell (PLC) architecture according to an embodiment.

Turning now to FIG. 1 a penta-level cell (PLC) architecture is shown in which a block 10 of non-volatile memory (NVM) supports five bits per cell. The illustrated block 10 includes a set of multi-level NVM cells (cell$_0$, cell$_1$, ..., cell$_n$), wherein each cell stores five bits (Bit 1, Bit 2, Bit 3, Bit 4, Bit 5). The cells may be programmed (e.g., written to) and read on a page-by-page basis, with each page corresponding to a particular bit. More particularly, a lower page (LP) may correspond to Bit 5, an upper page (UP, e.g.,) may correspond to Bit 4, a first extra page (XP1), may correspond to Bit 3, a second extra page (XP2) may correspond to Bit 2, and a top page (TP) may correspond to Bit 1. The group of 5 bits decide which voltage level the cell should be programmed to, requiring the total number of voltage levels (e.g., thirty-two in this case) to enable all possible bit combinations to be distinguished from one another.

In an embodiment, a first plurality of error correction codewords 12 (12a-12l) is programmed to a first set of pages 14 (LP, XP1, TP) in the block 10, wherein the first plurality of error correction codewords 12 is programmed at a first density (e.g., codeword density). In the illustrated example, the first density is four codewords per page (e.g., 32/32 packing, 32 sectors are stored in one page of 18592 Bytes), where each codeword 12 stores and/or corrects eight sectors of host data. More particularly, error correction codewords 12a-12d are programmed to the lower page, error correction codewords 12e-12h are programmed to the first extra page, and error correction codewords 12i-12l are programmed to the top page. The first plurality of error correction codewords 12 may be associated with a first error mitigation level such as, for example, about 1.5e-2. As will be noted, to achieve a greater error mitigation level of approximately 2e-2, a non-uniform codeword density may be used.

More particularly, a second plurality of error correction codewords 16 (16a-16f) is programmed to a second set of pages 18 (UP, XP2) in the block 10, wherein the second plurality of error correction codewords 16 is programmed at a second density (e.g., codeword density). In the illustrated example, the second density is three codewords per page (e.g., 24/32 packing, 24 sectors are stored in one page of 18592 Bytes), where each codeword 16 stores and/or corrects eight sectors of host data. More particularly, error correction codewords 16a-16c are programmed to the upper page and error correction codewords 16d-16f are programmed to the second extra page. Each of the codewords 16 includes more parity bits than the codewords 12. Accordingly, the second plurality of error correction codewords 16 may be associated with a second error mitigation level such as, for example, about 6.5e-2.

Thus, in order to support an average RBER of 2e-2, the illustrated solution uses different packings for the five pages. A 4 KB ECC engine with 24/32 packing supports a higher RBER of 6.5e-2 but stores 0.75 bits per page per cell instead of 1 bit per page per cell. Variable packing with two pages in the 24/32 packing and three pages in the 32/32 packing reduces the bits per cell for the block 10 to 4.5 bits per cell, but enables a target RBER goal of 5 bits per cell media to be met.

More particularly, for 5 bits per cell NAND, the RBER for any two level crossings is expected to be ~2e-2. Such a high RBER may not be supported by 4 KB codes in the 32/32 packing mode. As a compromise, capacity is sacrificed by programming two pages in the 24/32 packing and three pages in the 32/32 packing. The second set of pages 18 (e.g., the 24/32 packed pages) store three 4 KB ECC codewords per page instead of four codewords, but the 24/32 packed codewords are stronger and can support RBER ~6.5e-2. As will be discussed in greater detail, the level crossing involving reads of the second set of pages 18 may be brought close to one another. The level crossings involving reads of the first set of pages 14 (e.g., pages containing 32/32 packed codewords) may be given farther separation due to the weaker 4 KB code supporting RBER 1.5e-2. Overall, the average RBER of the 5 bit per cell NAND is met by the variable packing at the expense of a reduced capacity of 4.5 bit bits stored per cell.

The multi-level NVM cells may be part of a memory device that includes non-volatile memory and/or volatile memory. Non-volatile memory is a storage medium that does not require power to maintain the state of data stored by the medium. In one embodiment, the memory structure is a block addressable storage device, such as those based on NAND or NOR technologies. A storage device may also include future generation nonvolatile devices, such as a three-dimensional (3D) crosspoint memory device, or other byte addressable write-in-place nonvolatile memory devices. In one embodiment, the storage device may be or may include memory devices that use silicon-oxide-nitride-oxide-silicon (SONOS) memory, electrically erasable programmable read-only memory (EEPROM), chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory. The term "storage device" may refer to the die itself and/or to a packaged memory product. In some embodiments, 3D crosspoint memory may comprise a transistor-less stackable cross point architecture in which memory cells sit at the intersection of word lines and bit lines and are individually addressable and in which bit storage is based on a change in bulk resistance. In particular embodiments, a memory module with non-volatile memory may comply with one or more standards promulgated by the Joint Electron Device Engineering Council (JEDEC), such as JESD235, JESD218, JESD219, JESD220-1, JESD223B, JESD223-1, or other suitable standard (the JEDEC standards cited herein are available at jedec.org).

Volatile memory is a storage medium that requires power to maintain the state of data stored by the medium. Examples of volatile memory may include various types of random access memory (RAM), such as dynamic random access memory (DRAM) or static random access memory (SRAM). One particular type of DRAM that may be used in a memory module is synchronous dynamic random access memory (SDRAM). In particular embodiments, DRAM of the memory modules complies with a standard promulgated by JEDEC, such as JESD79F for Double Data Rate (DDR) SDRAM, JESD79-2F for DDR2 SDRAM, JESD79-3F for DDR3 SDRAM, or JESD79-4A for DDR4 SDRAM (these standards are available at jedec.org). Such standards (and similar standards) may be referred to as DDR-based standards and communication interfaces of the storage devices that implement such standards may be referred to as DDR-based interfaces.

Figure 2:
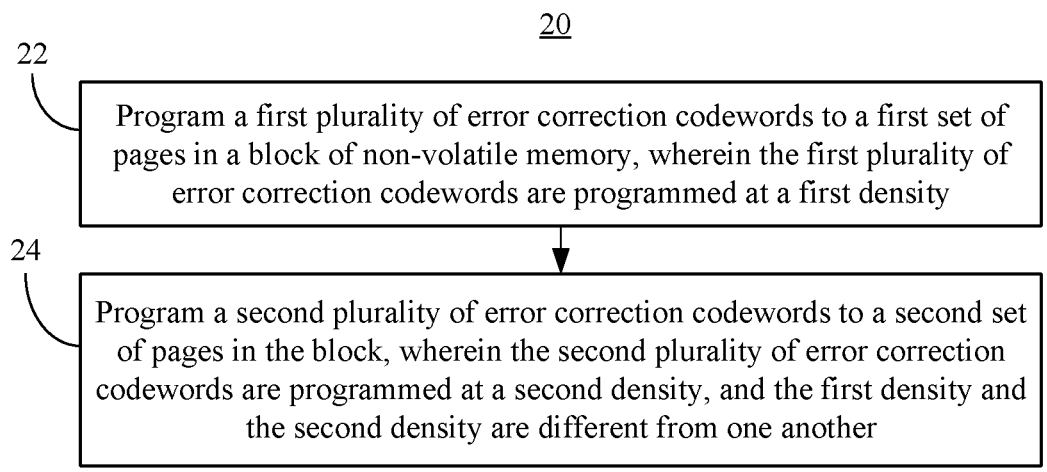
FIG. 2 is a flowchart of an example of a method of operating a memory controller according to an embodiment.

FIG. 2 shows a method 20 of operating a chip controller apparatus (e.g., memory controller). The method 20 may be implemented in one or more modules as a set of logic instructions stored in a machine- or computer-readable storage medium such as random access memory (RAM), read only memory (ROM), programmable ROM (PROM), firmware, flash memory, etc., in configurable logic such as, for example, programmable logic arrays (PLAs), field programmable gate arrays (FPGAs), complex programmable logic devices (CPLDs), in fixed-functionality hardware logic using circuit technology such as, for example, application specific integrated circuit (ASIC), complementary metal oxide semiconductor (CMOS) or transistor-transistor logic (TTL) technology, or any combination thereof.

Illustrated processing block 22 provides for programming a first plurality of error correction codewords to a first set of pages (e.g., NAND memory pages) in a block of non-volatile memory, wherein the first plurality of error correction codewords are programmed at a first density. Processing block 24 programs a second plurality of error correction codewords to a second set of pages (e.g., NAND memory pages) in the block, wherein the second plurality of error correction codewords are programmed at a second density. In the illustrated example, the first density and the second density are different from one another.

In an embodiment, the first plurality of error correction codewords are associated with a first error mitigation level and the second plurality of error correction codewords are associated with a second error mitigation level. Additionally, the first error mitigation level and the second error mitigation level may be different from one another.

With respect to a PLC, the first set of pages may consist of three pages, where the first density is four codewords per page. In such a case, the second set of pages may consist of two pages, where the second density is three codewords per page. As a result, the block may have a storage capacity of less than one bit per page per cell.

Figure 3:
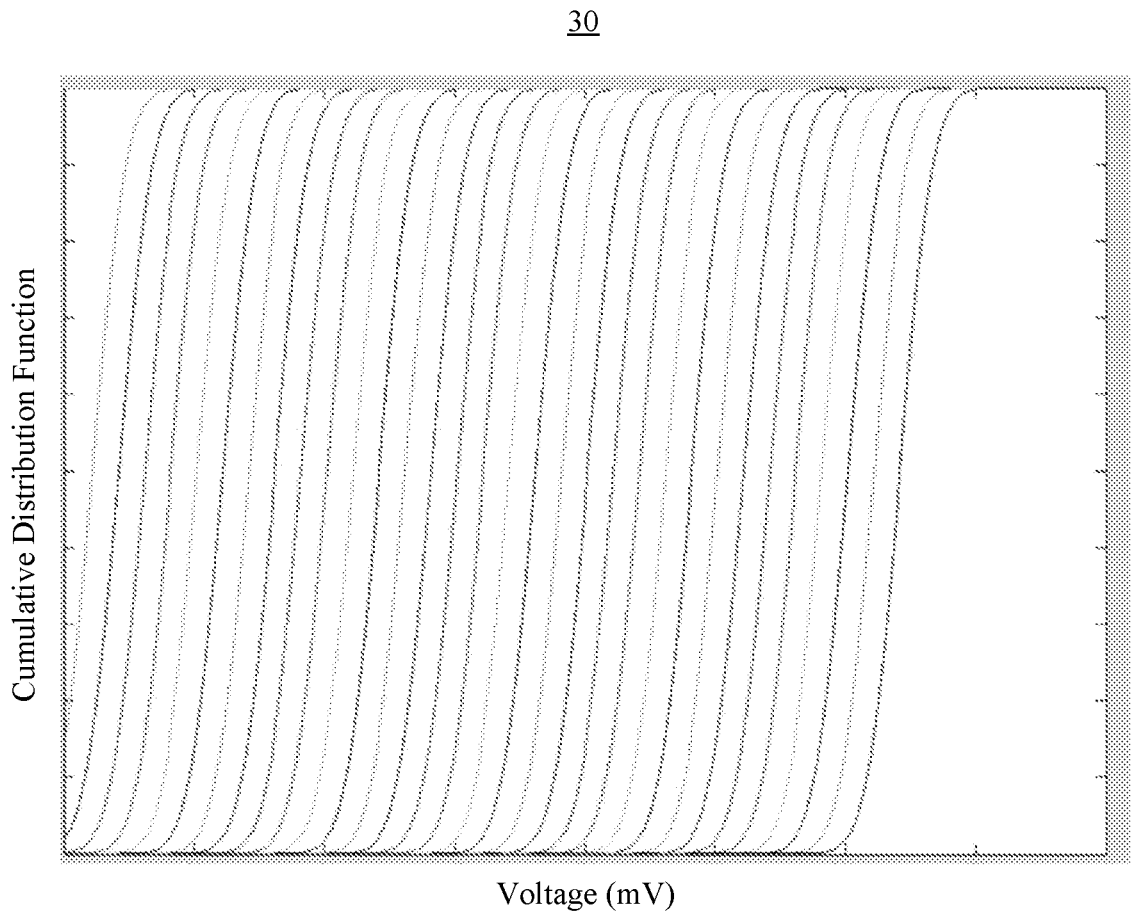
FIG. 3 is a plot of an example of level crossing spacings according to an embodiment.

FIG. 3 demonstrates that level crossings associated with the second set of pages may be more tightly spaced than level crossings associated with the first set of pages. More particularly, a plot 30 shows the level distributions of the thirty-two levels (levels A through f) of a 5 bit per cell NAND. On average, the RBER is expected to be in the range of 2e-2 (e.g., all pairs of levels crossing one another for a given page read have a total RBER of 2e-2). To meet such a relatively high RBER (e.g., with a page size of 18592 B), a 4 KB code may not be strong enough. As already noted, a 4 KB code with each page storing 32 sectors may be able to support an RBER of ~1.5e-2. To mitigate the higher RBER of 2e-2, an 8 KB or 16 KB code might be used. Many memory architectures, however, may support only 4 KB codewords. Moreover, the gate-count from a 8 KB or 16 KB code may add around 5% cost.

With 4 KB codes, an option may be to use inefficient packings, which store less than 32 sectors per page. Such an approach reduces the storage capacity from 5 bits per cell. For example, if 24 sectors are packed per page instead of 32 sectors, instead of four 4 KB codes, three 4 KB codes will be stored. The codes for 24/32 packing are stronger, but store only 0.75 bits per cell per page, making the memory device equivalent to a 3.75 bits per cell device, which is less than the capacity of a QLC (quad-level cell) architecture.

A hybrid or variable packing approach as described herein stores two pages in the 24/32 packed mode and three pages in the 32/32 packed mode. The 24/32 packed pages store 0.75 bits per page and the 32/32 packed pages store one bit per page. The capacity is therefore 2*0.75+3*1=4.5 bit bits per cell which is greater than QLC capacity. The RBER mitigation capability is ~6.5e-2 for the 24/32 packed codewords and 1.5e-2 for the 32/32 packed codewords. The average RBER from this hybrid/variable packing meets 5 bits per cell requirements. The pairs of level crossings involved in the 24/32 packed pages may be spaced closer to one another compared to the crossings involved in the 32/32 packed pages as shown in the plot 30. For a given read window budget (RWB), the closer spacings of the 24/32 packed levels may generate a sufficient window for the 32/32 packed pages to support the relaxed spacings required for the weaker 32/32 packed 4 KB code.

From an ECC perspective, the extra gate count to support one extra code is ~5% gates. Firmware support to incorporate two different ECC schemes may already available depending on the architecture. The 24/32 packed codes may also align with the boundaries for a 16 KB Indirection Unit (IU) size.

Figure 4:
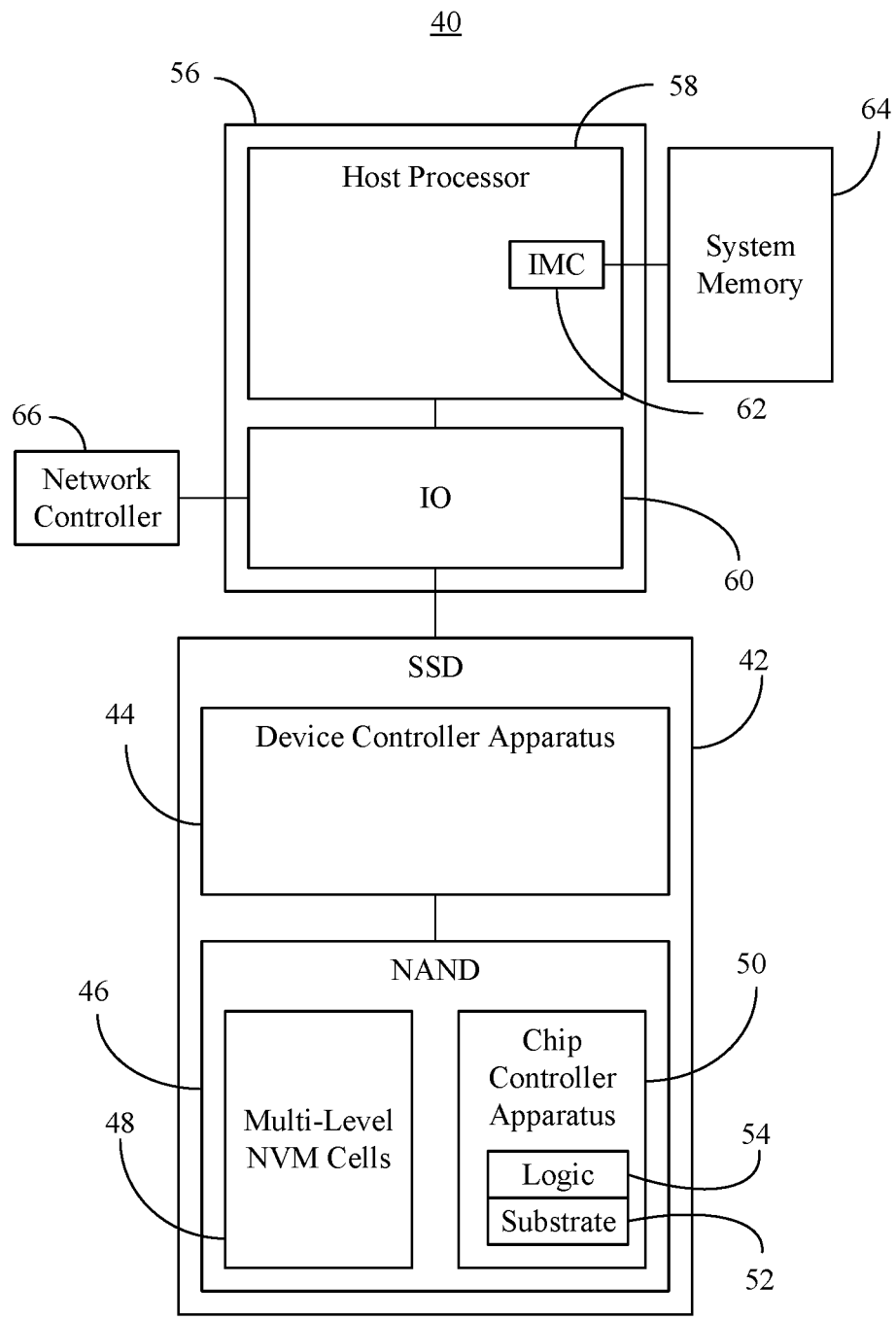
FIG. 4 is a block diagram of an example of a performance-enhanced computing system according to an embodiment.

Turning now to FIG. 4, a performance-enhanced computing system 40 is shown. In the illustrated example, a solid state drive (SSD) 42 includes a device controller apparatus 44 that is coupled to a NAND 46. The illustrated NAND 46 includes a set of multi-level NVM cells 48 and a chip controller apparatus 50 that includes a substrate 52 (e.g., silicon, sapphire, gallium arsenide) and logic 54 (e.g., transistor array and other integrated circuit/IC components) coupled to the substrate 52. The logic 54, which may include one or more of configurable or fixed-functionality hardware, may be configured to perform one or more aspects of the method 20 (FIG. 2), already discussed.

More particularly, the logic 54 may program a first plurality of error correction codewords to a first set of pages in a block of the NVM cells 48, wherein the first plurality of error correction codewords are programmed at a first density. Additionally, the logic 54 may program a second plurality of error correction codewords to a second set of pages in the block, wherein the second plurality of error correction codewords are programmed at a second density. In an embodiment, the first density and the second density are different from one another.

The illustrated system 40 also includes a system on chip (SoC) 56 having a host processor 58 (e.g., central processing unit/CPU) and an input/output (IO) module 60. The host processor 58 may include an integrated memory controller 62 (IMC) that communicates with system memory 64 (e.g., RAM dual inline memory modules/DIMMs). The illustrated IO module 60 is coupled to the SSD 42 as well as other system components such as a network controller 66.

In one example, the logic 54 includes transistor channel regions that are positioned (e.g., embedded) within the substrate 52. Thus, the interface between the logic 54 and the substrate 52 may not be an abrupt junction. The logic 54 may also be considered to include an epitaxial layer that is grown on an initial wafer of the substrate 52.

The computing system 40 is therefore considered performance-enhanced at least to the extent that programming codewords at different densities enables a more efficient tradeoff to be made between error mitigation and storage capacity. For example, PLC architectures may be supported without incurring a significant increase in gate count.

ADDITIONAL NOTES AND EXAMPLES

Example 1 includes a memory controller comprising one or more substrates and logic coupled to the one or more substrates, wherein the logic is at least partly implemented in one or more of configurable or fixed-functionality hardware, and the logic coupled to the one or more substrates is to program a first plurality of error correction codewords to a first set of pages in a block of non-volatile memory, wherein the first plurality of error correction codewords are programmed at a first density and program a second plurality of error correction codewords to a second set of pages in the block, wherein the second plurality of error correction codewords are programmed at a second density, and the first density and the second density are to be different from one another.

Example 2 includes the memory controller of Example 1, wherein the first plurality of error correction codewords are to be associated with a first error mitigation level, the second plurality of error correction codewords are to be associated with a second error mitigation level, and the first error mitigation level and the second error mitigation level are to be different from one another.

Example 3 includes the memory controller of Example 1, wherein the first set of pages is to consist of three pages, the first density is to be four codewords per page, the second set of pages is to consist of two pages, and the second density is to be three codewords per page.

Example 4 includes the memory controller of Example 3, wherein level crossings associated with the second set of pages are to be more tightly spaced than level crossings associated with the first set of pages.

Example 5 includes the memory controller of Example 1, wherein the block is to have a storage capacity of less than one bit per page per cell.

Example 6 includes the memory controller of any one of Examples 1 to 5, wherein the first plurality of error correction codewords and the second plurality of error correction codewords are programmed to NAND memory pages.

Example 7 includes a computing system comprising a memory controller, and a non-volatile memory (NVM) coupled to the memory controller, the NVM including a set of instructions, which when executed by the memory controller, cause the memory controller to program a first plurality of error correction codewords to a first set of pages in a block of the NVM, wherein the first plurality of error correction codewords are programmed at a first density, and program a second plurality of error correction codewords to a second set of pages in the block, wherein the second plurality of error correction codewords are programmed at a second density, and the first density and the second density are to be different from one another.

Example 8 includes the computing system of Example 7, wherein the first plurality of error correction codewords are to be associated with a first error mitigation level, the second plurality of error correction codewords are to be associated with a second error mitigation level, and the first error mitigation level and the second error mitigation level are to be different from one another.

Example 9 includes the computing system of Example 7, wherein the first set of pages is to consist of three pages, the first density is to be four codewords per page, the second set of pages is to consist of two pages, and the second density is to be three codewords per page.

Example 10 includes the computing system of Example 9, wherein level crossings associated with the second set of pages are to be more tightly spaced than level crossings associated with the first set of pages.

Example 11 includes the computing system of Example 7, wherein the block is to have a storage capacity of less than one bit per page per cell.

Example 12 includes the computing system of any one of Examples 7 to 11, wherein the block includes NAND memory.

Example 13 includes at least one computer readable storage medium comprising a set of instructions, which when executed by a memory controller, cause the memory controller to program a first plurality of error correction codewords to a first set of pages in a block of non-volatile memory, wherein the first plurality of error correction codewords are programmed at a first density, and program a second plurality of error correction codewords to a second set of pages in the block, wherein the second plurality of error correction codewords are programmed at a second density, and the first density and the second density are to be different from one another.

Example 14 includes the at least one computer readable storage medium of Example 13, wherein the first plurality of error correction codewords are to be associated with a first error mitigation level, the second plurality of error correction codewords are to be associated with a second error mitigation level, and the first error mitigation level and the second error mitigation level are to be different from one another.

Example 15 includes the at least one computer readable storage medium of Example 13, wherein the first set of pages is to consist of three pages, the first density is to be four codewords per page, the second set of pages is to consist of two pages, and the second density is to be three codewords per page.

Example 16 includes the at least one computer readable storage medium of Example 15, wherein level crossings associated with the second set of pages are to be more tightly spaced than level crossings associated with the first set of pages.

Example 17 includes the at least one computer readable storage medium of Example 13, wherein the block is to have a storage capacity of less than one bit per page per cell.

Example 18 includes the at least one computer readable storage medium of any one of Examples 13 to 17, wherein the first plurality of error correction codewords and the second plurality of error correction codewords are programmed to NAND memory pages.

Example 19 includes a method comprising programming a first plurality of error correction codewords to a first set of pages in a block of non-volatile memory, wherein the first plurality of error correction codewords are programmed at a first density, and programming a second plurality of error correction codewords to a second set of pages in the block, wherein the second plurality of error correction codewords are programmed at a second density, and the first density and the second density are to be different from one another.

Example 20 includes the method of Example 19, wherein the first plurality of error correction codewords are associated with a first error mitigation level, the second plurality of error correction codewords are associated with a second error mitigation level, and the first error mitigation level and the second error mitigation level are different from one another.

Example 21 includes means for performing the method of any one of claims 19 to 20.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A memory controller comprising:
one or more substrates; and
logic coupled to the one or more substrates, wherein the logic is at least partly implemented in one or more of configurable or fixed-functionality hardware, and the logic coupled to the one or more substrates is to:
program a first plurality of error correction codewords to a first set of pages in a block of non-volatile memory, wherein the first plurality of error correction codewords are programmed at a first density; and
program a second plurality of error correction codewords to a second set of pages in the block while bypassing the first set of pages, wherein the second plurality of error correction codewords are programmed at a second density, and the first density and the second density are to be different from one another.

2. The memory controller of claim 1, wherein the first plurality of error correction codewords are to be associated with a first error mitigation level, the second plurality of error correction codewords are to be associated with a second error mitigation level, and the first error mitigation level and the second error mitigation level are to be different from one another.

3. The memory controller of claim 1, wherein the first set of pages is to consist of three pages, the first density is to be four codewords per page, the second set of pages is to consist of two pages, and the second density is to be three codewords per page.

4. The memory controller of claim 1, wherein level crossings associated with the second set of pages are to be more tightly spaced than level crossings associated with the first set of pages.

5. The memory controller of claim 1, wherein the block is to have a storage capacity of less than one bit per page per cell.

6. The memory controller of claim 1, wherein the first plurality of error correction codewords and the second plurality of error correction codewords are programmed to NAND memory pages.

7. A computing system comprising:
a memory controller; and
a non-volatile memory (NVM) coupled to the memory controller, the NVM including a set of instructions, which when executed by the memory controller, cause the memory controller to:
program a first plurality of error correction codewords to a first set of pages in a block of the NVM, wherein the first plurality of error correction codewords are programmed at a first density, and
program a second plurality of error correction codewords to a second set of pages in the block while bypassing the first set of pages, wherein the second plurality of error correction codewords are programmed at a second density, and the first density and the second density are to be different from one another.

8. The computing system of claim 7, wherein the first plurality of error correction codewords are to be associated with a first error mitigation level, the second plurality of error correction codewords are to be associated with a second error mitigation level, and the first error mitigation level and the second error mitigation level are to be different from one another.

9. The computing system of claim 7, wherein the first set of pages is to consist of three pages, the first density is to be four codewords per page, the second set of pages is to consist of two pages, and the second density is to be three codewords per page.

10. The computing system of claim 9, wherein level crossings associated with the second set of pages are to be more tightly spaced than level crossings associated with the first set of pages.

11. The computing system of claim 7, wherein the block is to have a storage capacity of less than one bit per page per cell.

12. The computing system of claim 7, wherein the block includes NAND memory.

13. At least one computer readable storage medium comprising a set of instructions, which when executed by a memory controller, cause the memory controller to:
program a first plurality of error correction codewords to a first set of pages in a block of non-volatile memory, wherein the first plurality of error correction codewords are programmed at a first density; and
program a second plurality of error correction codewords to a second set of pages in the block while bypassing the first set of pages, wherein the second plurality of error correction codewords are programmed at a second density, and the first density and the second density are to be different from one another.

14. The at least one computer readable storage medium of claim 13, wherein the first plurality of error correction codewords are to be associated with a first error mitigation level, the second plurality of error correction codewords are to be associated with a second error mitigation level, and the first error mitigation level and the second error mitigation level are to be different from one another.

15. The at least one computer readable storage medium of claim 13, wherein the first set of pages is to consist of three pages, the first density is to be four codewords per page, the second set of pages is to consist of two pages, and the second density is to be three codewords per page.

16. The at least one computer readable storage medium of claim 15, wherein level crossings associated with the second set of pages are to be more tightly spaced than level crossings associated with the first set of pages.

17. The at least one computer readable storage medium of claim 13, wherein the block is to have a storage capacity of less than one bit per page per cell.

18. The at least one computer readable storage medium of claim 13, wherein the first plurality of error correction codewords and the second plurality of error correction codewords are programmed to NAND memory pages.

19. A method comprising:
programming a first plurality of error correction codewords to a first set of pages in a block of non-volatile memory, wherein the first plurality of error correction codewords are programmed at a first density; and
programming a second plurality of error correction codewords to a second set of pages in the block while bypassing the first set of pages, wherein the second plurality of error correction codewords are programmed at a second density, and the first density and the second density are to be different from one another.

20. The method of claim 19, wherein the first plurality of error correction codewords are associated with a first error mitigation level, the second plurality of error correction codewords are associated with a second error mitigation level, and the first error mitigation level and the second error mitigation level are different from one another.

* * * * *